United States Patent [19]

Morse et al.

[11] Patent Number: 4,786,831
[45] Date of Patent: Nov. 22, 1988

[54] INTEGRATING CAPACITIVELY COUPLED TRANSIMPEDANCE AMPLIFIER

[75] Inventors: Arthur L. Morse, Hawthorne; Steve D. Gaalema, Encinitas; Ingrid M. Keimel, Fountain Valley; Mary J. Hewitt, Playa Del Rey, all of Calif.

[73] Assignee: Hughes Aircraft Company, Los Angeles, Calif.

[21] Appl. No.: 682,112

[22] Filed: Dec. 17, 1984

[51] Int. Cl.⁴ ............... G06G 7/12; H03K 3/42; H03K 5/159; G01J 1/00
[52] U.S. Cl. ..................... 307/490; 307/311; 307/353; 250/338.1; 328/128; 328/151
[58] Field of Search .......... 250/338 R; 328/127, 328/150, 151, 128; 307/490, 352, 353, 501, 311, 228

[56] References Cited

U.S. PATENT DOCUMENTS

| | | | |
|---|---|---|---|
| 3,636,458 | 1/1972 | Sugiyama et al. | 328/151 |
| 3,868,580 | 2/1975 | Battjes | 330/156 |
| 4,075,576 | 2/1978 | Eden | 330/277 |
| 4,313,067 | 1/1982 | White | 307/311 |
| 4,439,693 | 3/1984 | Lucas et al. | 307/353 |
| 4,578,646 | 3/1986 | Maio et al. | 328/128 |

FOREIGN PATENT DOCUMENTS 0739549 6/1980 U.S.S.R. .................. 307/491

OTHER PUBLICATIONS

Hewitt et al., patent application Ser. No. 06/458,607, filed Jan. 17, 1983.

*Primary Examiner*—Stanley D. Miller
*Assistant Examiner*—Trong Quang Phau
*Attorney, Agent, or Firm*—Ronald L. Taylor; W. J. Streeter; A. W. Karambelas

[57] ABSTRACT

An amplifier circuit 12 for an infrared detector 10 in a detector array formed on a large-scale integrated structure. The amplifier circuit is fabricated along with the detector on the structure and includes an amplifier stage capacitively coupled 14 to the detector 10 and an output stage. A switching FET 16 is provided to selectively couple the detector to an external biasing source and another switching FET 24 is provided to reset the amplifier stage after an integration period. In one embodiment the output stage 28 includes a storage capacitor 30 selectively coupled to the amplifier stage by a switching FET 32. In another embodiment the output encoding stage 28 includes a two-gate FET 32 to control the voltage on a storage capacitor 30. The two-gate FET controls a voltage source which periodically pulses and drains the capacitor. One FET gate is connected to the amplifier stage output and the other is connected to a clocking signal. In still another embodiment the output stage 128 includes a second capacitor 132 of smaller capacitance onto which a charge of the first capacitor 130 proportional to the output of the amplifier stage is placed for subsequent sampling.

8 Claims, 4 Drawing Sheets

4,786,831

INTEGRATING CAPACITIVELY COUPLED TRANSIMPEDANCE AMPLIFIER

BACKGROUND OF THE INVENTION

1. Field of the Invention

The present invention concerns amplifier circuits for infrared detectors and more particularly amplifier circuits suitable for fabrication along with a detector array on a single large-scale integrated structure.

2. Background of the Invention

A number of applications have been developed for infrared surveillance systems employing a cryogenically cooled photovoltaic infrared detector array arranged on a large-scale integrated structure. In some of these applications, the source under surveillance may have a very low infrared photon output differing only slightly from the background infrared radiation level. Typical of such applications are space-based sensing of regional agricultural conditions and absolute radiometric measurements.

Usually each infrared detector element in the array is provided with an individual amplifier circuit, preferably with both the detector array and the dedicated amplifiers fabricated on a single large-scale integrated structure. Due to the environment in which the infrared survey system operates, it is generally desirable to minimize power requirements and heat dissipation.

Photovoltaic infrared detectors have conventionally been amplified by discrete component transimpedance-type amplifier circuits, such as shown in FIG. 1, typically employing a discrete amplifier variably biasing the detector. Discrete component transimpedance amplifiers, however, are not compatible with large-scale integrated technology and generally require unacceptable levels of power to operate.

Another conventional detector amplifier circuit is the so-called synthetic transimpedance amplifier circuit, an example of which is shown in FIG. 2. In this circuit the detector is coupled to both a buffer FET and an amplifier with the output of the amplifier coupled to the gate of the buffer FET. The currnnt produced by the detector is directly injected into a storage capacitor with the potential across the capacitor periodically sampled by an external circuit. Thus, the current output of the detector is converted into a voltage which is in part related to the size of the storage capacitor. A reset FET, coupled to a reference voltage and controlled by a clock pulse, periodically resets the storage capacitor. A source follower amplifier is used to buffer the storage capacitor from the external circuit.

Synthetic transimpedance amplifiers, while compatible with large-scale integrated array applications, still suffered from a number of disadvantages. Typically the bias across the detector was determined by a bias across the buffer FET gate. This precluded optimally biasing the detector, reduced the uniformity of detector biasing, and increased apparent detector noise. The input impedance of the synthetic transimpedance amplifier is equal to the voltage change or detector input required to increase the current by $e^1$ divided by the detector current. Thus, for small detector currents, the synthetic transimpedance amplifier input impedance increased, resulting in a decreased injection efficiency.

Consequently, there presently exists a need for a photovoltaic infrared detector amplifier circuit which is suitable for large-scale integrated structure fabrication, provides for independent optimal biasing of the detector array, and has an increased injection efficiency.

SUMMARY OF THE INVENTION

The present invention provides a novel circuit, and technique for employing that circuit, for amplifying and reading signals in an infrared surveillance system. Preferably the circuit is fabricated on a semi-conductor substrate along with the infrared detector array and produces an output which is coupled to the external electronics of the surveillance system.

In general terms, the circuit, in a presently preferred embodiment, comprises an independent biasing source selectively coupled to a photovoltaic infrared detector. In the illustrated embodiment, the detector is capacitively coupled to an integrating amplifier for sensing the detector output. Switching means are provided for selectively coupling the detector to the biasing source in a first time period and for uncoupling the biasing source from the detector while the output of the detector is sensed in a second time period.

Since the bias across the detector is determined by an external source instead of a bias applied to a FET gate as in previous designs, the detector bias may be maintained at an optimum value, thereby reducing detector noise and improving detector responsivity uniformity. This circuit also increases the acceptable temperature of operation by reducing the resistance requirements of the detector arrays.

The novel features which are believed to be characteristic of the present invention will be better understood from the following detailed description considered in connection with the accompanying drawings, wherein various circuits embodying the present invention are described.

DETAILED DESCRIPTION OF THE INVENTION

Figures 1, 2, 3:
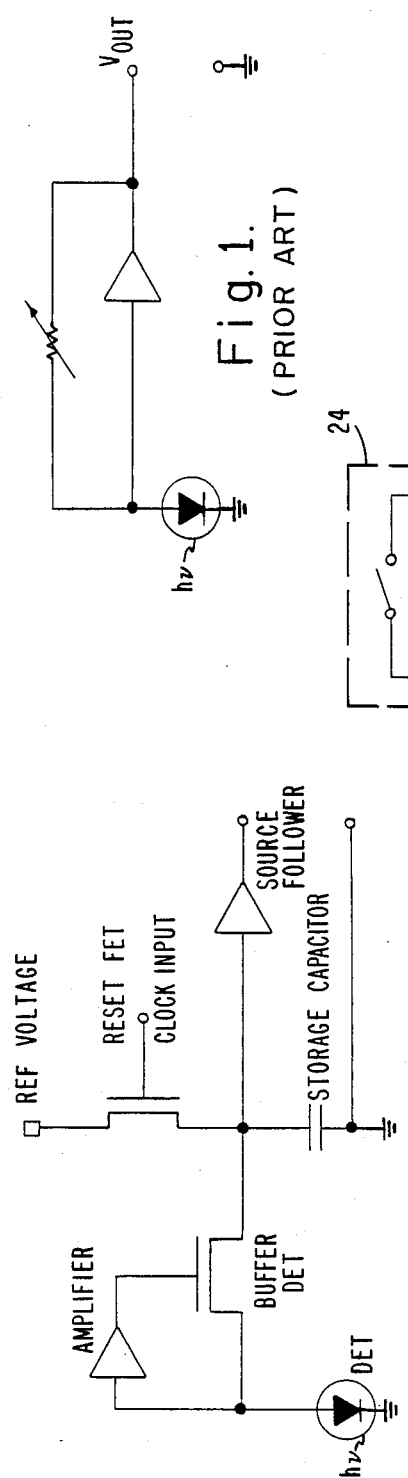
FIG. 1 is a schematic diagram of a prior art discrete component transimpedance amplifier circuit.
FIG. 2 is a schematic diagram of a prior art synthetic transimpedance amplifier circuit.
FIG. 3 is a schematic diagram of a generalized circuit embodying the present inventive circuit.

Referring to the figures, and more particularly FIG. 3 thereof, there is shown a schematic diagram of one embodiment of the present inventive circuit suitable for explaining the present inventive technique. The circuit includes an infrared detector 10 connected to an amplifier stage 12 by a coupling capacitor 14 and connected to an external biasing source (not shown) by a detector reset switch 16. An integrating capacitor 18 is connected across an input node 20 and an output node 22 of amplifier stage 12 to provide integrating amplification of the output from detector 10. A capacitor reset switch 24 is connected across opposing nodes 20, 22 of the integrating capacitor 18. The amplifier stage output node 22 is also connected to a sampling switch 26 of an output encoding stage 28 which also includes a storage capacitor 30 and a source follower amplifier 32. The source follower 32 buffers storage capacitor 30 from an external signal sensing and analyzing circuit (not shown) which does not form a part of the present invention. The output from the ouput encoding stage 28 is read between output nodes 34a,b.

In operation, detector reset switch 16 and capacitor reset switch 24 are closed in a first time period so as to initially bias the detector 10 and initialize the integrating amplifier stage. Sampling switch 26 is initially open, thereby isolating the output encoding stage 28 during the initial biasing period of detector 10. After the detector is biased to an optimal potential, the detector reset switch 16 and capacitor reset switch 24 are opened in a second time period. This places an initial V(1) at the amplifier output node 22 due to switching noise associated with opening the detector and capacitor reset switches 16, 24. Capacitor reset switch 24 is opened slightly before detector reset switch 16 to avoid biasing detector 10 with switching noise generated by opening capacitor reset switch 24. Sampling switch 26 is then momentarily closed to place a voltage V(1)' on storage capacitor 30 proportional to the initial switching noise induced potential on output node 22. Sampling switch 26 is again opened to isolate the output encoding stage during the integration of output from detector 10.

While detector 10 is isolated from the external biasing source during the second or integration period, this time interval may be made sufficiently brief so as to leave detector 10 substantially unaffected by the interruption of bias. The voltage V(1)' on storage capacitor 30 is measured and stored by the external sensing circuit during the integration period.

At the end of the integration period, sensing switch 26 is closed and a voltage V(2)' proportional to the integrated output voltage V(2)' at the amplifier output node 22 is stored on storage capacitor 30. Sensing switch 26 is again opened and detector 10 and integrating amplifier stage 12 are reset by closing detector and capacitor reset switches 16, 24. During this reset period, the voltage V(2)' on storage capacitor 30 is again sampled and stored by the external sensing circuit. The difference in potentials V(2)'−V(1)' is proportional to the integrated photon flux incident on detector 10 over the integration period.

A second cycle begins when detector and capacitor reset switches 16, 24 are again opened and sensing switch 26 is momentarily closed again. In the embodiments discussed below, the circuits representing the output encoding stages either include a means for resetting storage capacitor 30 or, alternatively, the potential across storage capacitor 30 is allowed to equilibrate with the voltage at amplifier output node 22.

Figure 4:
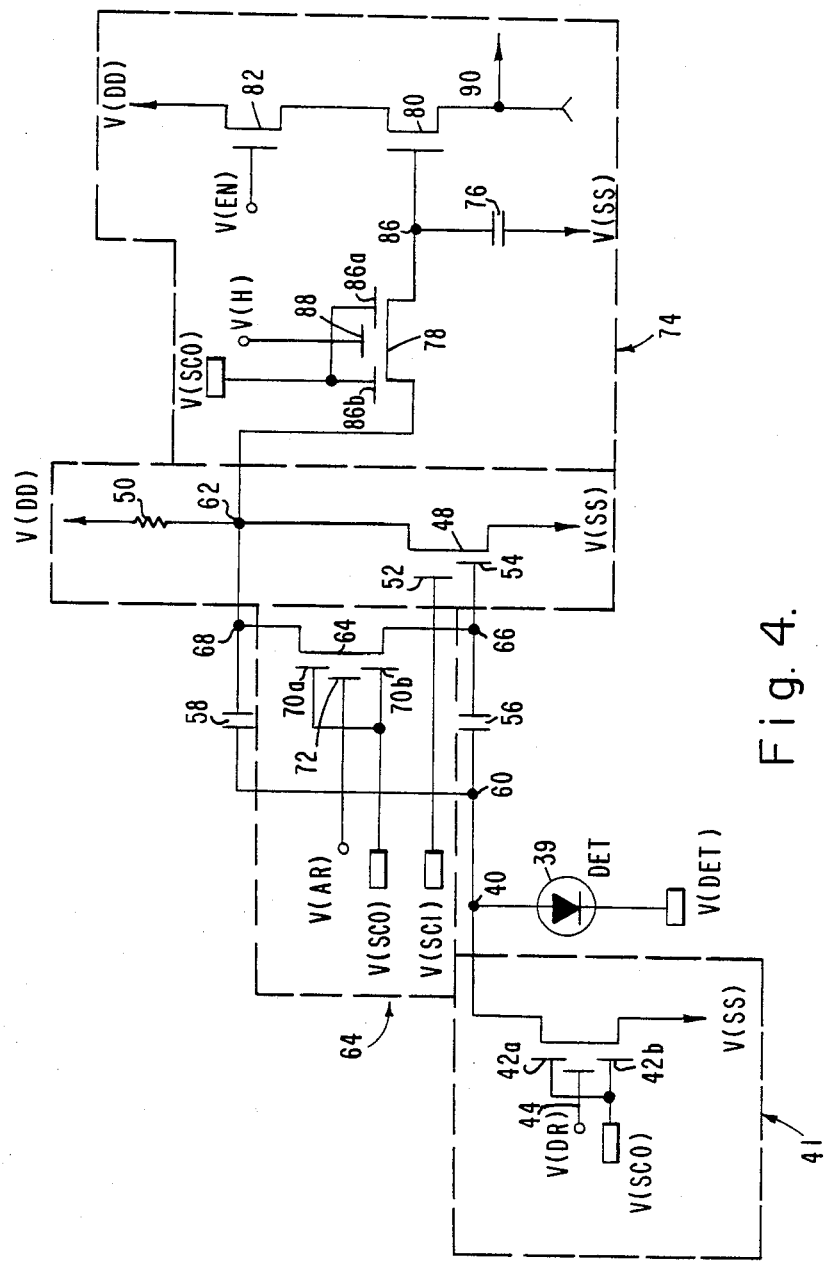
FIG. 4 is a schematic diagram of a preferred embodiment of the present inventive circuit.
Figure 5:
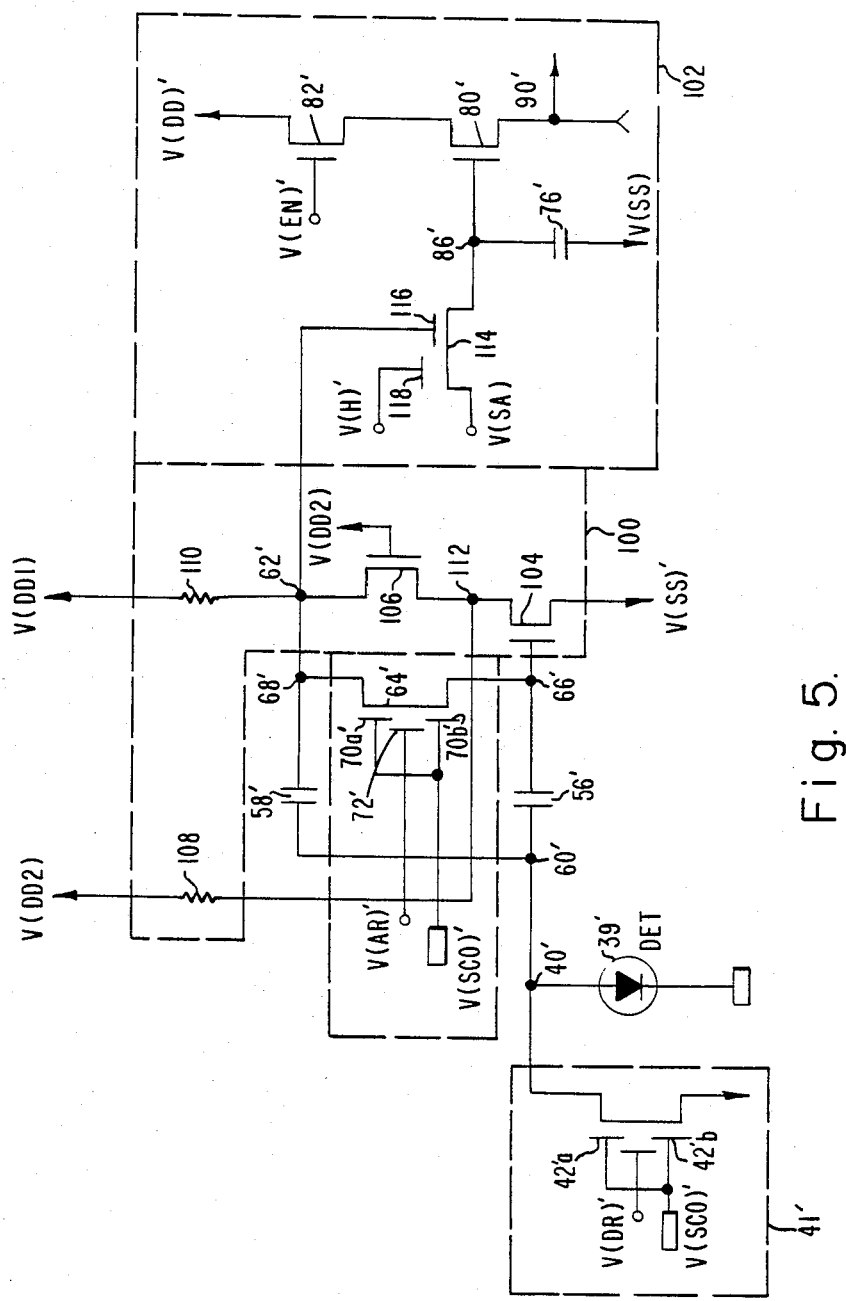
FIG. 5 is a schematic diagram of another preferred embodiment of the present inventive circuit.
Figure 6:
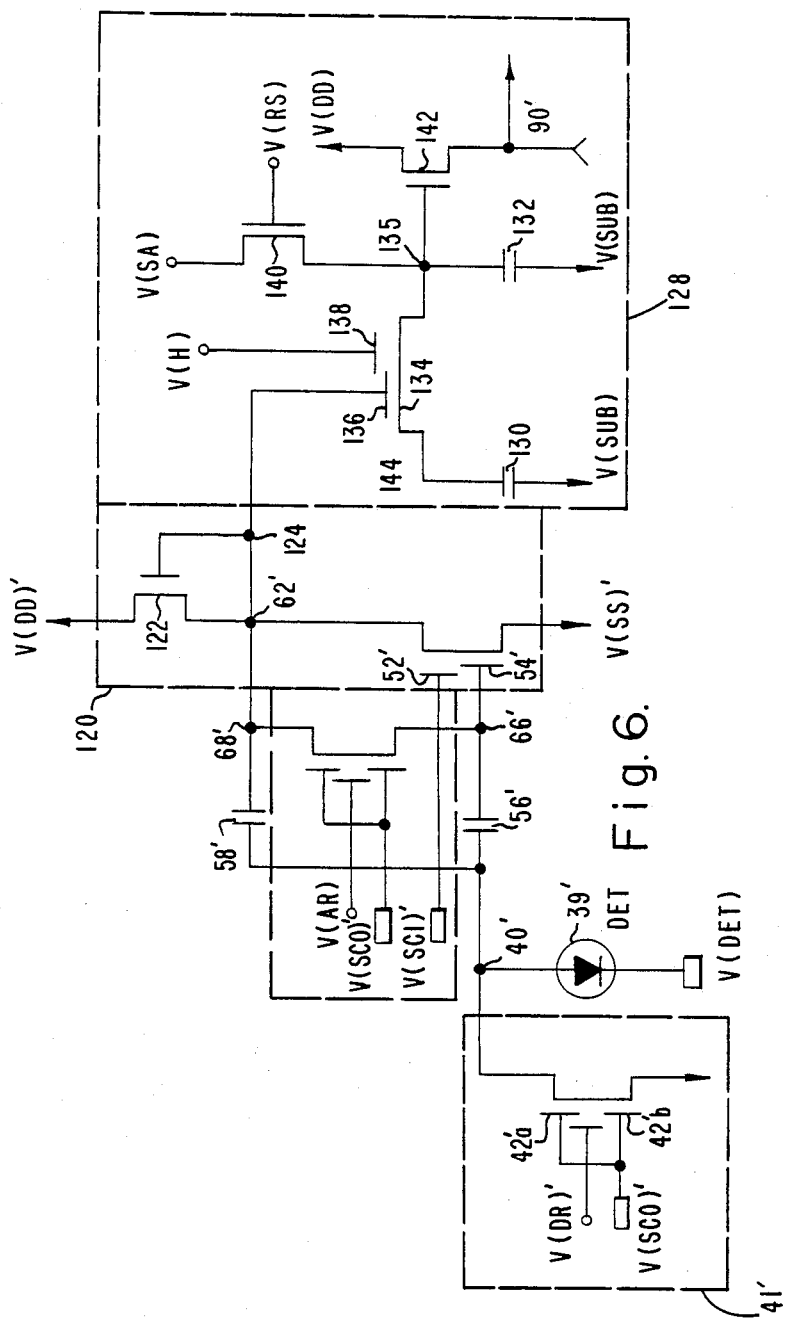
FIG. 6 is a schematic diagram of still another preferred embodiment of the present inventive circuit.

FIGS. 4, 5 and 6 show various implementations of the integrating capacitively coupled transimpedance amplifier circuit discussed above. In these various implementations, detector and capacitor reset switches 16, 24 are FETs. By sampling the voltages V(1)' and V(2)' on storage capacitor 30 in the manner discussed above and obtaining a voltage V(2)'−V(1)' which is proportional to the integrated photon flux incident on the detector 10, several sources of noise are substantially eliminated. First, kTC switching noise associated with the reset FETs is substantially eliminated since this noise is essentially the proportional voltage V(1)' initially obtained from storage capacitor 30. Low frequency substrate noise and 1/f noise is greatly diminished since the sampling rate of storage capacitor 30 can be much higher than many conventional techniques. Also, since the same reset bias level is applied to both the reset and signal levels of the output wave form, common noise associated with both is cancelled out in obtaining V(2)'−V(1)'. As discussed above, the use of an external biasing source on detector 10 allows for optimal biasing of the detector, thereby enhancing its responsivity.

The circuit shown in FIG. 4 is essentially an FET implementation of the inventive amplifier circuit shown in FIG. 3. In this embodiment, negative going pulses turn the various FETs on.

In FIG. 4 a single infrared detector 39 of a large-scale integrated structure array is connected across the constant voltage source V(DET) and a detector signal node 40. A resetting bias voltage is supplied through a switching FET 41 having its legs respectively connected to the detector signal node 40 and a constant voltage source V(SS). This switching FET 41 includes two constant potential gates 42a,b connected to a constant voltage source V(SCO), which are oppositely disposed about an enabling gate 44 connected to a first clocking voltage source V(DR). Switching FET designs of this type are well known in the industry as one method of minimizing the switching noise associated with the opening and closing of switching FET 41.

The gain stage in this circuit comprises an amplifier FET 48 with its legs connected across a constant voltage source V(SS) and a polysilicon load resistor 50 which is in turn connected to a constant voltage source V(DD). Amplifier FET 48 has a source-drain shielding gate 52 connected to a constant voltage source V(SCl) and a signal gate 54 connected to the detector 39 by a coupling capacitor 56. As with the switching FET connected to node 40, amplifier FET designs having a source drain shielding gate and a signal gate are also well known in the industry and need not be discussed at length here.

Integrating amplification is provided by an integrating capacitor 58 connected across a detector signal node 60 and an amplifier stage signal output node 62. The integrating capacitor 58 is reset by a switching FET 64 having its legs connected across an amplifier input node 66 and an output node 68. The switching FET 64 has the same configuration as the switching FET connected to node 40, having two constant voltage gates 70a,b connected to the constant voltage source V(SCO) which are oppositely disposed about an enabling gate 72 connected to a second clocking voltage source V(AR).

The output encoding stage 74 (shown in partial lines) includes a storage capacitor 76, switching FET 78, source follower FET 80 and enabling source follower FET 82. The storage capacitor 76 is connected across the constant voltage source V(SS) and storage node 86. The switching FET 78 has its legs connected across amplifier signal output node 62 and storage node 86. The switching FET 78 is configured similarly to switching FETs 41, 64, having two constant voltage gates 86a,b connected to the constant voltage source V(SCO) and oppositely disposed about an enabling gate 88 which is connected to a third clocking voltage source V(H).

Storage node 86 is connected to the gate of source follower FET 80. The transimpedance amplifier circuit output signal is read by an external electronic sensing and storing circuit between a signal node 90, connected to a leg of source follower FET 80, and constant voltage source V(SS). The enabling source follower FET 82, having its legs respectively connected across source follower FET 80 and constant load voltage source V(DD) and its gate connected to an enabling clocking voltage source V(EN), provides a means for switching the various detectors in the array with respect to the external electronic sensing and storage circuit. An output voltage will only be read when enabling FET 82 receives a negative going pulse on its gate from enabling voltage source V(EN).

In operation, the detector 39 and amplifier gain stage are reset by negative going pulses from clocking voltage sources V(DR) and V(AR) closing switching FETs 41, 64. The enabling and disabling pulses from clocking voltage source V(AR) are nested within the enabling and disabling pulses of clocking voltage source V(DR) to avoid reset transients on the detector. At this point, switching FETs 64, 41 are respectively opened with detector signal node 40 at the level V(SS) −V(DET) while amplifier signal output node 62 and amplifier FET input node 66 are one threshold below the level at detector signal node 40. The pulse level from clocking voltage source V(H) is low at this point, with switching FET 78 open so that the reset switching voltage at amplifier signal output node 62 is also the voltage on storage capacitor 76. This voltage is held on storage capacitor 76 as clocking voltage source V(H) opens switching FET 78 and integration of the detector current starts. When integration is complete, switching FET 78 is closed and the final integrated voltage at amplifier signal output node 62 is placed on storage capacitor 76. Switching FET 78 is then opened again to remove any offsets caused when switching FET 78 was closed. The output from the amplifier circuit is sampled by external sensing and store electronics once before the end of integration and once after switching FET 78 is reopened after the integration period. The difference between the two sampled amplifier output signals is proportional to the integrated detector output.

An alternative embodiment of the present inventive capacitively coupled transimpedance amplifier circuit is shown in FIG. 5. In this circuit, the detector 39', capacitor 56', integrating capacitor 58', switching FETs 41', 64' and associated constant and clocking voltage sources are the same as described in FIG. 4 (primed numbers and letters indicate like elements). However, the amplifier stage 100 and output encoding stage 102 are different.

The amplifier stage 100 consists of an amplifier FET 104, buffer FET 106 and split polysilicon resisters 108, 110. The impedance ratio between resistors 108/110 is approximately 1/10. The legs of the amplifier FET 104 are respectively coupled to constant voltage source V(SS)' and one leg of the buffer FET 106. The opposing leg of the buffer FET 106 and one end of load resister 110 are coupled to the amplifier signal output node 62'. The opposite end of load resister 110 is connected to a constant voltage source V(DD1). Load resister 108 bridges a constant voltage source V(DD2) and a node 112 between amplifier FET 104 and buffer FET 106. The gate of buffer FET 106 is connected to the constant voltage source V(DD2). This amplifier stage provides a $G_m$ gain enhancement allowing for an increase in gain over a conventional amplifier stage, such as shown in FIG. 4, with 50 percent of the power.

The output encoding stage 102 employs a gate sampling technique rather than directly loading a storage capacitor with the output voltage of the amplifier stage. The output encoding stage 102 includes a storage capacitor 76' along with the signal output buffer and switching elements shown in FIG. 4, including source follower FET 90', enabling source follower FET 82', enabling voltage source V(EN)' and constant voltage source V(DD)'. In place of a switching FET, however, a gate sampling FET 114 is employed. The legs of the gate sampling FET 114 are respectively connected to a storage node 86' and a diffusion clocking voltage source V(SA). The gate sampling FET 114 has a sampling gate 116 connected to the amplifier signal output node 62 and a clocking gate 118 connected to a clocking voltage source V(H)'.

In operation, the detector and amplifier stage are reset in the same manner as the embodiment illustrated in FIG. 4. Detector signal node 40' is at a voltage level V(SS)'−V(DET)' while amplifier signal output node 62' and amplifier FET input node 66' are at one threshold level below detector signal node 40'. The output from clocking voltage source V(H)' is low at this point so that gate sampling FET 114 is closed. The output from diffusion clocking voltage source V(SA) is then pulsed, raising the voltage on storage capacitor 76' to the pulsed voltage level. As the output from voltage source V(SA) returns to its low value, the voltage level of storage capacitor 76' follows until it reaches the surface potential under sampling gate 116. This surface potential is proportional to the amplifier stage reset voltage caused by opening switching FETs 41', 72'. The output from gate clocking voltage source V(H)' then goes high so that sampling FET 114 becomes open and the amplifier stage reset noise voltage is held on storage capacitor 76'. At this point the integration of the current output from detector 39' begins. At the end of the integration period, clocking voltage source V(H)' goes low and storage capacitor 76' discharges until it reaches the surface potential under sampling gate 116. This surface potential is proportional to the integrated voltage level at amplifier signal output node 62. The output at node 90' is sampled once immediately before and after the integration time. The difference in the two successive samples is again proportional to the integrated detector output. The advantages of a gate sampling output encoding circuit stem from the fact that the voltage wave form from amplifier signal output node 62' is now controlling the gate of a FET semi-conductive element. This isolates the amplifier signal output voltage at nodes 62' so that the signal coming from the detector need not be stiff.

Still another embodiment of the present inventive capacitively coupled transimpedance amplifier circuit is illustrated in FIG. 6. In this circuit, the detector elements, integrating capacitor and related switching elements are the same as those illustrated in FIGS. 4, 5 (primed numbers and symbols indicate like elements). The amplifier stage 120 in the circuit is similar to that illustrated in FIG. 4 except that the polysilicon load resister 50 has been replaced with a depletion load FET 122. The legs of the depletion load FET 122 are connected across amplifier signal output node 62' and a constant voltage source V(DD)'. The gate of depletion load FET 122 is connected to a node 124 which is level with amplifier signal output node 62'. Amplifier stages incorporating depletion load FETs are well known in the prior art and need not be discussed at length.

The optical encoding stage 128 employs a circuit that may be referred to as charge amplifier circuit. In this output stage, two storage capacitors 130, 132 are respectively connected to the legs of an isolation FET 134. The opposite end of storage capacitors 130, 132 are both connected to a constant voltage source V(SUB). A sampling gate 136 of isolation FET 134 is connected to node 124. An isolation gate 138 of FET 134 is connected to a clocking voltage source V(H). The common line between storage capacitor 132 and isolation FET 134 are connected to a storage signal node 135. A reset FET 140 bridges a clocking voltage source V(SA) and storage signal node 135. The gate of reset FET 140 is connected to another clocking voltage source V(RS). Storage signal node 135 is also connected to the gate of a source follower FET 142 having its legs respectively attached to a signal output node 90' and the constant voltage source V(DD).

In operation, the detector and amplifier stage are reset as discussed above in relation to the circuit illustrated in FIGS. 4, 5. At this point, clocking voltage sources V(H) and V(RS) are low or go low so that both isolation FET 134 and reset FET 140 are closed. Clocking voltage source V(SA) is then pulsed high, raising storage capacitors 130, 132 to this level. As clociing voltage source V(SA) returns to a low value, storage capacitor 130 follows clocking voltage source V(SA) until the voltage level reaches the surface potential under sampling gate 136. This surface potential is proportional to the amplifier reset switching noise voltage on amplifier signal output node 62' and source follower gate 136. Clocking voltage source V(H) then goes high so that this voltage level proportional to the amplifier reset switching noise voltage is held on storage capacitor 130 and integration begins. At the end of integration, clocking voltage source V(SA) goes low to drain storage capacitor 132. Clocking voltage source V(RS) then goes high to open reset FET 140 and clocking voltage source V(H) goes low to close isolation FET 134. At this point, storage capacitor node 144 is at the voltage to the switching noise amplifier reset voltage and amplifier signal output node 62' is at the amplified detector integrated voltage. Storage capacitor 130 is now at a higher potential than sampling gate 136 and, therefore, excess charge flows over to storage capacitor 132. Assuming that the capacitance of storage capacitor 130 is greater than that of storage capacitor 132, the voltage change across storage capacitor 132 will be larger than that across storage capacitor 130 by the ratio of the two capacitances.

In accordance with the circuits and signal sampling techniques discussed above, a infrared detector amplifier circuit may be achieved which provides improved detector responsivity lower power consumption and lower noise levels. It will, of course, be understood that others skilled in the art and employing the techniques described herein may modify the circuits illustrated herein witout departing from the scope of the present invention. For example any of the gain stages and output encoding stages illustrated in FIGS. 4-6 may be interchanged with one another. Consequently, the scope of the present invention should not be limited by the particular embodiments described above but should be defined only by the claims set forth below and equivalents thereof.

What is claimed is:

1. An amplifier circuit for an infrared detector of a detector array fabricated on a large scale integrated structure, said amplifier circuit comprising:
   biasing means, separate from said detector, for biasing said detector,
   switching means, fabricated on said large scale integrated structure, connected between said biasing means and said detector, for selectively coupling said biasing means to said detector during a first time period and for decoupling said biasing means from said detector during a second time period, and
   amplifying means, connected to an output terminal of said detector, fabricated on said large scale integrated structure, for amplifying an output signal of said detector during said second time period.

2. The amplifier circuit of claim 1 further comprising a storage means, connected to an output terminal of said amplifying means, fabricated on said large scale integrated structure, for storing an output of said amplifying means.

3. The amplifier circuit of claim 2 further comprising switching means, connected between said storage means and said output terminal of said amplifying means, fabricated on said large scale integrated structure, for selectively coupling and decoupling said storage means to and from, respectively, an output terminal of said amplifying means.

4. The amplifier circuit of claim 3 wherein said switching means decouples said storage means from said output terminal of said amplifying means at a first time during said first time period and momentarily couples said storage means at a second time during said second time period.

5. An amplifier circuit for an infrared detector array fabricated on a large scale integrated structure, said amplifier circuit comprising:
   biasing means, separate from said detector, for biasing said detector,
   switching means, fabricated on said large scale integrated structure, connected between said biasing means and said detector, for selectively coupling said biasing means to said detector during a first time period and for decoupling said biasing means from said detector during a second time period,
   amplifying means, connected to an output terminal of said detector, fabricated on said large scale integrated structure, for amplifying an output signal of said detector during said second time period, and
   output means for providing a voltage proportional to an output signal of said amplifying means, connected to an output terminal of said amplifying means, comprising:
   a capacitive element; and
   voltage controlling means responsive to a voltage output of said amplifying means for controlling a voltage on said capacitive element.

6. The circuit of claim 5 wherein said voltage controlling means comprises an FET transistor having an enable gate and a voltage control input gate coupled to said output terminal of said amplifying means, said FET transistor being responsive to an enable signal at said enable gate for controlling said voltage on said capacitive element in accordance with said output signal of said amplifying means.

7. An amplifier circuit for an infrared detector array fabricated on a large scale integrated structure, said amplifier circuit comprising:
   biasing means, separate from said detector, for biasing said detector,
   switching means, fabricated on said large scale integrated structure, connected between said biasing means and said detector, for selectively coupling said biasing means to said detector during a first time period and for decoupling said biasing means from said detector during a second time period, amplifying means, connected to an output terminal of said detector, fabricated on said large scale integrated structure, for amplifying an output signal of said detector during said second time period, and output means for providing a voltage proportional to an output signal of said amplifying means, connected to an output terminal of said amplifying means, comprising:

a first capacitive element, a second capacitive element having a capacitance less than that of said first capacitive element, charging means for periodically charging and draining said first and second capacitive elements, connected individually to said first and second capacitive elements, and transfer means, bridging said capacitive elements, for controlling the flow of charge between said first and second capacitive elements in accordance with said output signal of said amplifying means wherein a charge is stored on said first capacitive element proportional to said output signal of said amplifying means and then transfered to said second capacitive element.

8. The circuit of claim 7 wherein said transfer means comprises an FET transistor having an enable gate and a voltage control input gate coupled to said output terminal of said amplifying means, said FET transistor being responsive to an enable signal at said enable gate for controlling a transfer of charge from said first capacitive element to said second capacitive element in accordance with said output signal of said amplifying means.

* * * * *